US012765387B2

(12) United States Patent
Lee et al.

(10) Patent No.: US 12,765,387 B2
(45) Date of Patent: Oct. 13, 2026

(54) METHOD FOR MAKING A SEMICONDUCTOR DEVICE

(71) Applicant: JCET STATS ChipPAC Korea Limited, Incheon (KR)

(72) Inventors: SeungHyun Lee, Incheon (KR); SeongHwan Park, Incheon (KR); InHo Seo, Seoul (KR); Bom Lee, Incheon (KR)

( * ) Notice: Subject to any disclaimer, the term of this patent is extended or adjusted under 35 U.S.C. 154(b) by 461 days.

(21) Appl. No.: 18/469,572

(22) Filed: Sep. 19, 2023

(65) Prior Publication Data

US 2024/0105638 A1 Mar. 28, 2024

(30) Foreign Application Priority Data

Sep. 27, 2022 (CN) ......................... 202211184714.3

(51) Int. Cl.
*H01L 23/552* (2006.01)
*B23K 26/38* (2014.01)
(Continued)

(52) U.S. Cl.
CPC ............ *H10W 42/20* (2026.01); *B23K 26/38* (2013.01); *H10W 74/016* (2026.01); *H10W 74/114* (2026.01); *B23K 2101/40* (2018.08)

(58) Field of Classification Search
CPC ... H01L 23/552; H01L 23/3121; H01L 23/31; H01L 23/49822; H01L 23/498; H01L 23/66; H01L 23/3128; H01L 23/3107; H01L 23/5381; H01L 23/538; H01L 23/5386; H01L 21/565; H01L 21/56; H01L 21/561; H01L 25/16; H01L 25/065; H01L 25/0655; H01L 25/18; H01L 21/4846; H01L 21/48; H01L 21/78; B23K 26/38; B23K 26/3128; B23K 26/402; B23K 26/0036; B23K 2101/40; B23K 2101/42; B23K 2101/32; B23K 26/362; H01R 12/52; H10W 42/20; H10W 42/273; H10W 42/276; H10W 74/016; H10W 74/01;
(Continued)

(56) References Cited

U.S. PATENT DOCUMENTS 9,226,435 B2 12/2015 Fisher, Jr. et al.
10,658,303 B1 5/2020 Vincent et al.
(Continued)

FOREIGN PATENT DOCUMENTS

TW 201017857 A 5/2010
TW 201103118 A 1/2011
TW 201119004 A 6/2011

*Primary Examiner* — Nikolay K Yushin
(74) *Attorney, Agent, or Firm* — .Junhe Law Office, P.C.; Yi Zhang

(57) ABSTRACT

A semiconductor device comprises a substrate comprising a conductive pattern and a conductive bar on the conductive pattern; at least one electronic component on the substrate; an encapsulant layer formed on the substrate and covering the at least one electronic component, a shielding layer extending at least partially over the substrate, the substrate comprises an opening over at least a portion of the conductive bar, the portion being exposed from the encapsulant layer and the substrate, the shielding layer extending within the opening and being electrically connected with the conductive bar in the opening, wherein the opening is adjacent to the encapsulant layer or is extended by an aperture in the encapsulant layer.

9 Claims, 6 Drawing Sheets

(51) Int. Cl.

*H10W 42/20* (2026.01)
*H10W 74/01* (2026.01)
*H10W 74/10* (2026.01)
*B23K 101/40* (2006.01)

(58) Field of Classification Search

CPC . H10W 74/114; H10W 74/10; H10W 74/014; H10W 74/117; H10W 74/111; H10W 90/00; H10W 90/401; H10W 90/701; H10W 90/753; H10W 70/685; H10W 70/05; H10W 70/04; H10W 70/65; H10W 44/20; H10W 44/248; H10W 20/42; H10W 20/435; H10W 20/41; H10P 54/00

See application file for complete search history.

(56) References Cited

U.S. PATENT DOCUMENTS

| | | | |
|---|---|---|---|
| 10,985,109 | B2 | 4/2021 | Kim et al. |
| 2018/0063948 | A1 | 3/2018 | Vincent |
| 2019/0172792 | A1 | 6/2019 | Yoo |
| 2021/0366838 | A1 | 11/2021 | Han et al. |
| 2022/0007554 | A1 | 1/2022 | Jeon |

METHOD FOR MAKING A SEMICONDUCTOR DEVICE

TECHNICAL FIELD

The present application generally relates to semiconductor technology, and more particularly, to a semiconductor device, in particular a semiconductor device, and a method for making a semiconductor device.

BACKGROUND OF THE INVENTION

For electronic components in an electronic product, electromagnetic interference (EMI) shielding needs to be implemented to prevent disruption by electromagnetic field, electrostatic field, etc. Furthermore, the EMI shielding for electronic components is generally required to be grounded via a contact pad through a grounding slot. Since an encapsulant or other molding compound is deposited over the electronic components to form an encapsulant layer for providing electrical isolation and mold flash occurs when some molten plastic escapes from the mold cavity, the grounding slot has to be arranged at a distance from the edge of the encapsulant layer. As shown in FIG. 1, in a semiconductor package 10, a distance A of at least 350 μm is required between an encapsulant layer 2 and a grounding slot 3 due to mold flash issue. This impedes further improvement of the form factor of a semiconductor package. For example, this may also increase a distance between electronic components 1 shielded by a shielding layer 6 and other unshielded electronic components 5, for example border-to-border connectors mounted on a same substrate 4, which is not desired.

Therefore, a need exists for an improved method for making semiconductor devices with shielding layers.

SUMMARY OF THE INVENTION

An objective of the present application is to provide a semiconductor device and a method for making such semiconductor device.

According to an aspect of the present application, a semiconductor device is provided. The semiconductor device comprises: a substrate comprising an interconnection structure and a conductive bar connected to the interconnection structure; at least one electronic component on the substrate; an encapsulant layer formed on the substrate and covering the at least one electronic component, a shielding layer extending at least partially over the substrate, the substrate comprising an opening over at least a portion of the conductive bar, the portion being exposed from the encapsulant layer and the substrate, the shielding layer extending within the opening and being electrically connected with the conductive bar in the opening, wherein the opening is adjacent to the encapsulant layer or is extended by an aperture in the encapsulant layer.

According to another aspect of the present application, a method for making a semiconductor device is provided. The method comprises: providing a substrate comprising a an interconnection structure and a conductive bar connected to the interconnection structure; forming at least one electronic component on the substrate; forming an encapsulant layer covering the at least one electronic component; removing a portion of the encapsulant layer and a portion of the substrate which is at least partially under the portion of the encapsulant layer to expose at least a portion of the conductive bar; depositing a conductive material on the substrate to form a shielding layer on the substrate, wherein the shielding layer extends at least partially over the portion of the conductive bar exposed from the encapsulant layer and the substrate to electrically connect with the conductive bar.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As aforementioned, mold flash may occur for an encapsulant layer of a semiconductor device, since some molten encapsulant material may escape from a mold cavity during an injection molding process. The escaped encapsulant material may undesirably require more space around the encapsulant layer to be formed. In order to address this issue, the inventors of the present application conceived a method that uses laser ablation to remove the undesired encapsulant material after the molding process.

Figure 1:
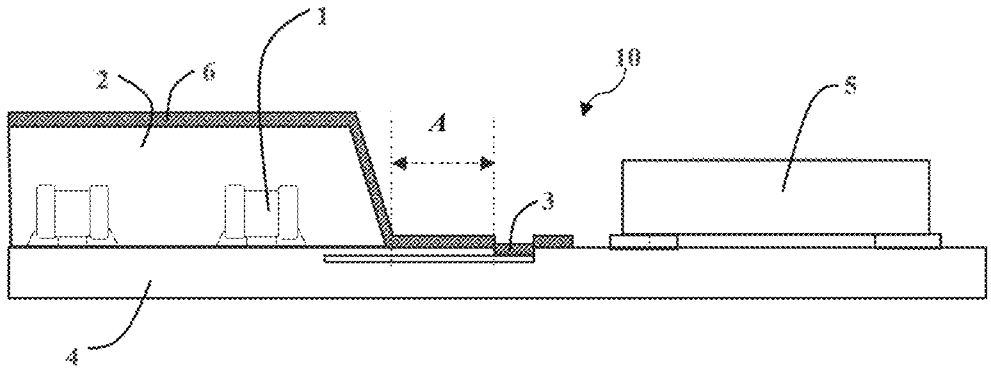
FIG. 1 illustrates a system-in-package (SiP) module.
Figure 2A:
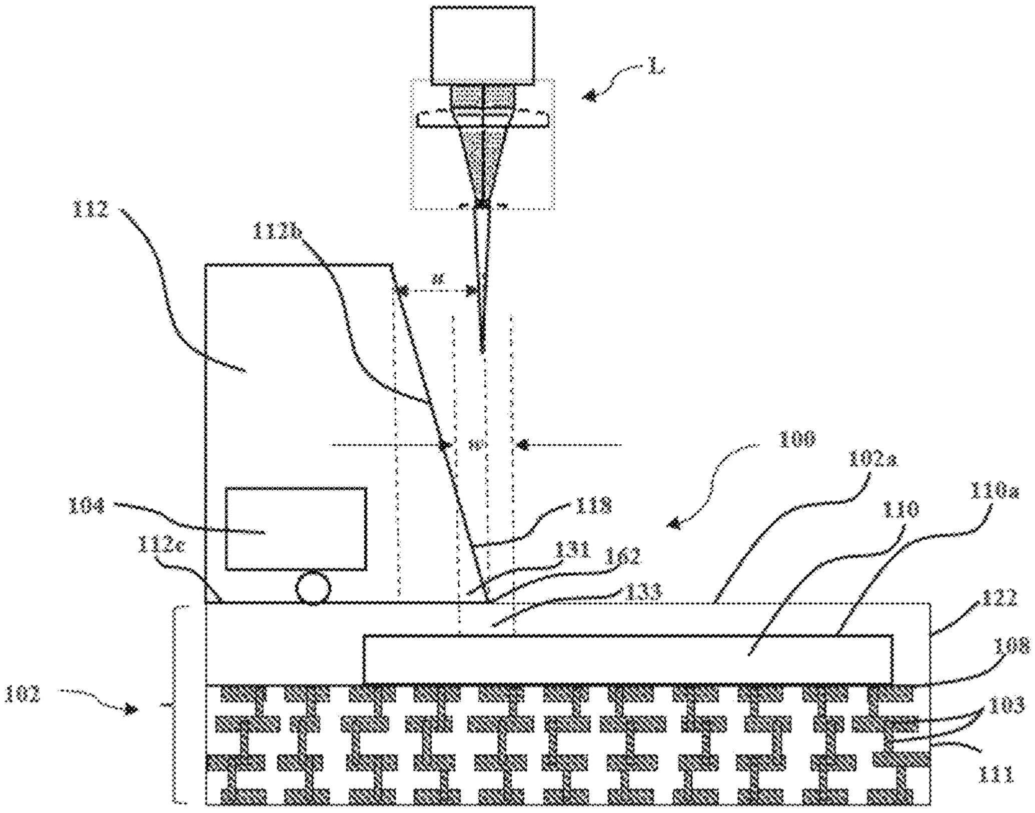
FIGS. 2A to 2C illustrate partial cross-sectional views of various steps of a process for making a semiconductor device according to an embodiment of the present application, respectively before and after laser cutting, and after deposition of a shielding layer.
Figure 2B:
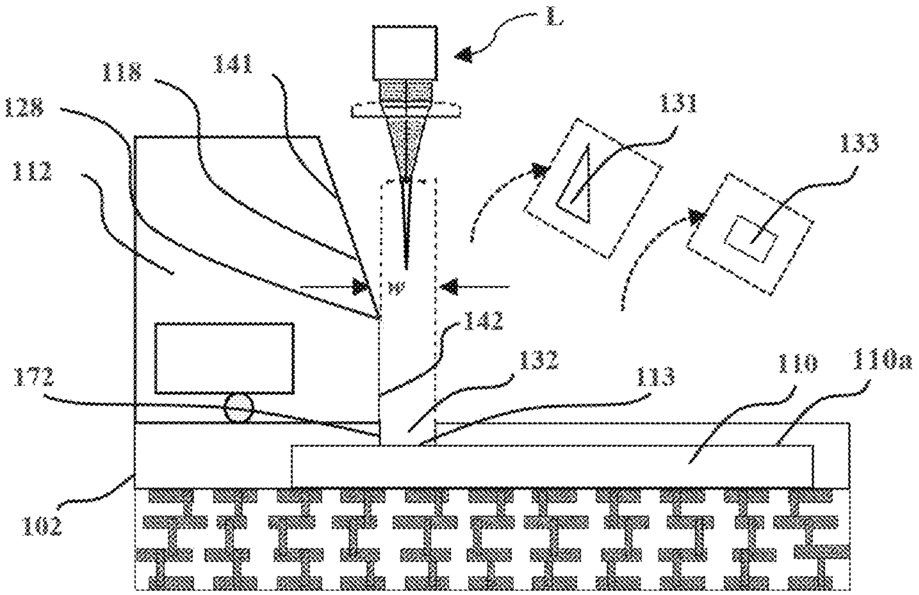
Figure 2C:
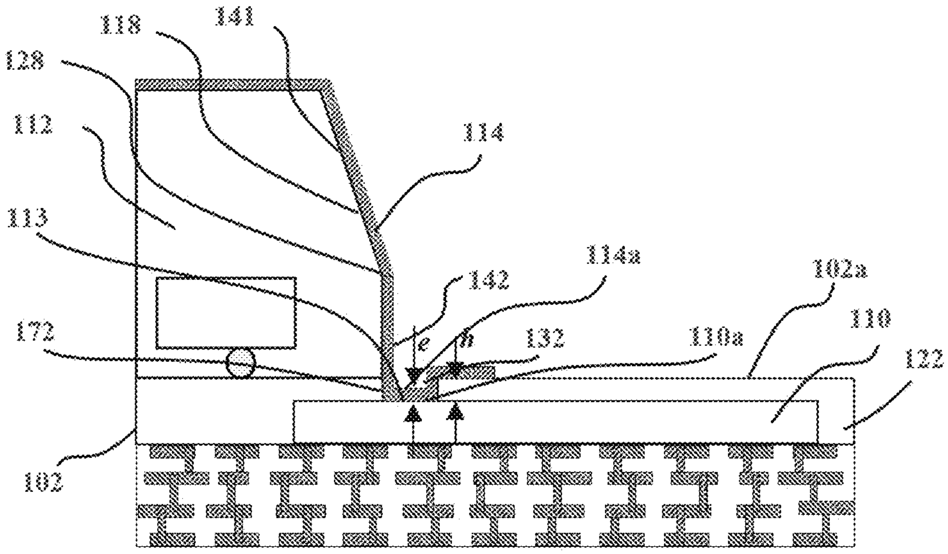

FIGS. 2A to 2C illustrate cross-sectional views of various steps of a process for making a semiconductor device according to an embodiment of the present application. The process may be implemented on a semiconductor device 100 which needs further encapsulation to improve its durability and reliability.

As shown in FIG. 2A, the semiconductor device 100 includes a substrate 102. The substrate 102 can be a printed circuit board or another suitable substrate that can support and interconnect various electronic components. In the embodiment illustrated in FIG. 2A, the substrate 102 includes a base layer 111, a top layer 122, and one or more interconnection structures 103 formed in the substrate 102 especially inside the base layer 111. The base layer 111 is for example an insulating layer and the top layer 122 is for example a passivation layer. In some embodiments, the substrate 102 may include one or more laminated layers of polytetrafluoroethylene pre-impregnated, FR-4, FR-1, CEM-1, or CEM-3 with a combination of phenolic cotton paper, epoxy, resin, woven glass, mat glass, polyester, and other reinforcement fibers or fabrics. The substrate can also be a multi-layer flexible laminate, ceramic, copper clad laminate, or glass. The one or more interconnection structures 103 may include contact pads, conductive traces, and conductive vias configured as necessary to implement a desired signal routing. The passivation layer may be formed from any suitable material for a passivation layer, including those mentioned above with regard to the insulating layer or layers.

A conductive bar 110 is formed within the substrate 102, for example at least partially within a topmost portion of the base layer 111. The conductive bar 110 can be formed on the one or more interconnection structures 103 in the substrate 102, for example to elevate the conductive surface of the interconnection structures 103 for electrically coupling to the ground or other voltage reference. When viewed from the top of the semiconductor device 100, the conductive bar 110 and the interconnection structures 103 are preferably entirely covered by the top layer 122 to maintain them electrically isolated from the external environment. In some embodiments, the conductive bar 110 can be a preformed metal bar or other similar structures, which can be connected to the interconnection structures 103 formed on the substrate 102. Alternatively, the conductive bar 110 can be deposited on the substrate 102 using a lift-off process or other appropriate metal deposition and patterning processes. The conductive bar 110 can be made of copper, aluminum, silver or other suitable metal materials, for example. In some embodiments, the conductive bar 110 may be a portion of the interconnect structures 103 which is topmost of the interconnect structures 103.

The conductor device 100 includes at least one electronic component 104 mounted on the substrate 102. In some embodiments, the electronic component 104 may be a semiconductor die without any packaging material, while in some other embodiments, the electronic component 104 may be a semiconductor package. In some embodiments, the at least one electronic component 104 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The electronic component may also include discrete components such as resistors, capacitors, inductors, etc.

An encapsulant layer 112 is formed on the substrate 102 by molding to cover the electronic component 104. For example, the encapsulant layer 112 may be deposited on the substrate 102 using compressive molding, transfer molding or liquid encapsulant molding. In some embodiments, the encapsulant layer 112 may be made of a polymer composite material such as epoxy resin with filler, epoxy acrylate with filler, or polymer with proper filler, for example. The encapsulant layer 112 is preferably non-conductive. Such a layer may also provide structural support and/or protect the electronic components from external elements or contaminants. The encapsulant layer 112 may be deposited with a shielding layer, as will be elaborated below in more details. The encapsulant layer 112 can protect the electronic component 104 from external circumstances. In some embodiments, a grinding operation can be performed on the encapsulant layer 112 to reduce a thickness of the encapsulant layer 112 and, optionally, to expose the electronic component 104.

Generally, the encapsulant layer 112 may be formed using an injection molding process where a mold cover or chase (not shown) is used. During the molding process, the mold cover may cover the at least one electronic component 104 and accommodate them within a mold cavity. To allow for easy removal of the mold cover after the injection molding process, the mold cavity generally has a truncated shape such as a truncated prism. In the embodiment shown in FIG. 2A, the encapsulant layer 112 formed may have a shape of a truncated prism, with sloping peripheral portions including a sidewall 118. The sidewall 118 defines a side surface 112*b* of the encapsulant layer 112. However, in some other embodiments, the encapsulant layer 112 may have a generally vertical sidewall.

As shown in FIG. 2A, the encapsulant layer 112 partially overlaps with the conductive bar 110, with a portion directly above the conductive bar 110. For example, the sidewall 118 may be directly above the conductive bar 110. Since the sidewall 118 is the portion of the encapsulant layer 112 where mold flash occurs, it is desired to remove at least a portion of the sidewall 118 (especially at a foot of the sidewall 118) to address the mold flash issue. Accordingly, as shown in FIGS. 2A and 2B, a portion 131 of the encapsulant layer 112, which is at the foot of the sidewall 118, and a portion 133 of the substrate 102, which is mainly under the portion 131, can be removed by a laser L, to expose the conductive bar 110 from the encapsulant layer 112 and the substrate 102. In some embodiments, the laser L may be a diode-pumped solid-state (DPSS) laser, an exciplex laser with ArF, KrF, XeCl, XeF, or another suitable excimer, ultraviolet, visible, infrared, an yttrium aluminum garnet (YAG) laser doped with neodymium, erbium, ytterbium, or another suitable material, or a CO2 laser with ps, ns, ps, or fs pulses. Various lenses can be used as desired, e.g., focus, collimator, apochromat, achromat. Mirrors, scanners, slits, filters, or other suitable devices can be used to guide or condition the light signal from laser to the desired position on the substrate 102. In some other embodiments, the method may include disposing a mask above the substrate before laser cutting.

The removed portion 131 of the encapsulant layer 112 may include at least a lower portion of the sidewall 118. As shown in FIG. 2B, an opening 132 is formed in the substrate 102 over a portion 113 of the conductive bar 110 exposed from the encapsulant layer 112 and the substrate 102. A width w of the opening 132 is less than a width u of the sidewall 118 in the illustrated embodiments of FIGS. 2A and 2B. However, the width w of the opening 132 may be adjusted in other examples. It can be seen that the opening 132 does not overlap with any of the electronic components 104 encapsulated by the encapsulant layer 112, to avoid damage to the components 104 by the laser L. Also, the opening 132 may not expose the entirety of the conductive bar 110, but a portion of the conductive bar 110 that is sufficient for the grounding purpose. In the following, the portion of the conductive bar 110 exposed from the encapsulant layer 112 and the substrate 102 is also referred to as the exposed portion 113 of the conductive bar 110. Preferably, the exposed portion 113 of the conductive bar 110 is on a top surface 110*a* of the conductive bar 110. It should be understood that the portion 113 may be covered later by one or more layers different from the encapsulant layer and the substrate, for example the shielding layer as will be elaborated in more detail below with regard to FIG. 2C. The shielding layer may be in contact with the conductive bar 110, for example over the entire surface of the exposed portion 113.

In the embodiment of FIGS. 2A and 2B, the laser L cuts the encapsulant layer 112 and the substrate 102 in a direction perpendicular to a top surface 102*a* of the substrate 102. The laser L reaches a bottom surface 112*c* of the encapsulant layer 112 and further reaches the conductive bar 110 at the end of the laser ablation. It can be appreciated that the conductive bar 110 may serve as an ablation-stop layer during the laser cutting process. For example, the laser ablation may stop when the conductive bar 110 is exposed and detected in real-time by an optical microscopy in communication with laser L.

In some embodiments, the width w of the opening 132 and the position of the laser cutting is chosen such that the sidewall 118 becomes angled. In the embodiment of FIG. 2B, after the laser cutting, the side surface 112*b* may include an upper portion or upper side surface 141 and a lower portion or lower side surface 142. The upper side surface 141 is sloped and the lower side surface 142 is perpendicular with regard to the bottom surface 112*c* of the encapsulant layer 112. The upper and lower side surfaces 141, 142 of the encapsulant layer 112 may be situated on opposite side of a ridge 128 extending parallel to the bottom surface 112*c* of the encapsulant layer 112. An internal surface 172 of the opening 132 may be extended at least partially by the lower side surface 142. By a surface extended or extended at least partially by another surface, it should be understood that planes defined by these surfaces coincide at least partially. The surfaces and thus the planes can be flat or non-flat, for example curved. A slope angle of a side surface should be understood as the angle between the side surface and the bottom surface 112*c* of the encapsulant layer 112.

Figure 2D:
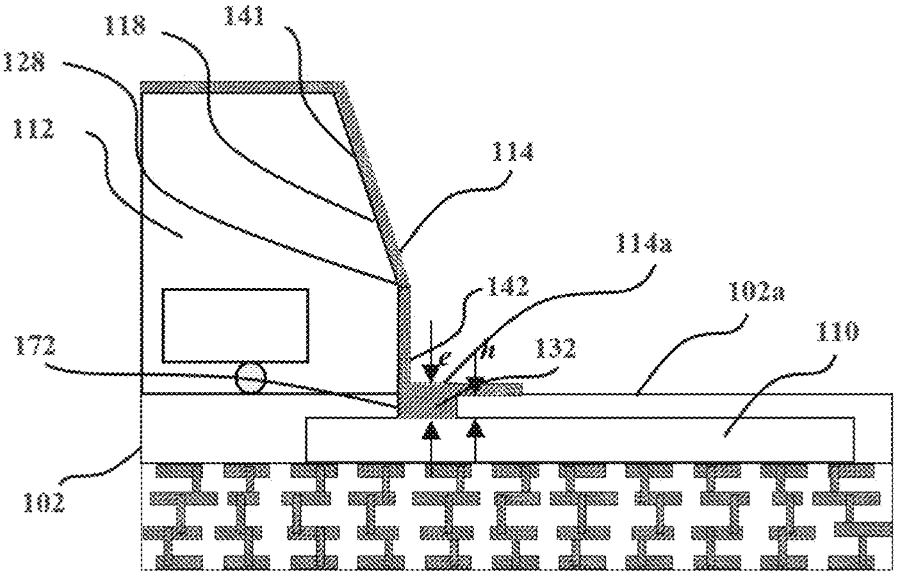
FIG. 2D illustrates a cross-sectional view of a variant of the semiconductor device shown in FIG. 2C.

As illustrated in FIGS. 2C and 2D, a shielding layer 114 may then be deposited onto the substrate 102. The shielding layer 114 shields EMI induced or generated by the electronic component 104. The shielding layer 114 may be formed by depositing a conductive material such as Al, Cu, Sn, Ni, Au, Ag, or any other suitable material for electromagnetic interference (EMI) shielding onto the substrate. In some embodiments, a sputtering process, or other similar chemical or physical vapor deposition process can be used to form the shielding layer 114. The shielding layer 114 can fill completely or partially the opening 132 in the substrate 102 and in connection with the conductive bar 110 exposed by the opening 132. In this way, the conductive bar 110 may interconnect the shielding layer 114 with the interconnection structures 103 inside the substrate 102. In some embodiments, a deposition mask (not shown) can optionally be used to allow the shielding layer 114 to be formed selectively on the substrate 102. Preferably, the shielding layer 114 covers the top surface 102*a* of the substrate 102 on its portion adjacent to the opening 132, on a side of the opening 132 opposite to the encapsulant layer 112.

The shielding layer 114 preferably covers entirely the encapsulant layer 112 (except the bottom surface 112*c* thereof) and extends continuously between the encapsulant layer 112 and the opening 132. The conductive material may be in contact with the top surface 110*a* of the conductive bar 110. The opening 132 may thus form a grounding slot. A gap between the exposed portion 113 of the conductive bar 110 and the encapsulant layer 112 due to mold slash issues can thus be avoided. Preferably, the shielding layer 114 covers entirely the exposed portion 113 of the conductive bar 110 and the internal surface 172 of the opening 132. In some embodiments as shown in FIG. 2C, a thickness e of the shielding layer 114 in the opening 132 may be smaller than a height h of the opening 132 (i.e., the top surface 102*a* of the substrate 102 thus being above the top surface 114*a* of the shielding layer 114 in the opening 132).

In a variant as illustrated in FIG. 2D, the conductive material fills completely the opening 132. A thickness e of the shielding layer 114 in the opening 132 is preferably larger than a height h of the opening 132. A top surface 114*a* of the shielding layer 114 in the opening 132 thus protrudes above the top surface 102*a* of the substrate 102.

Figure 3:
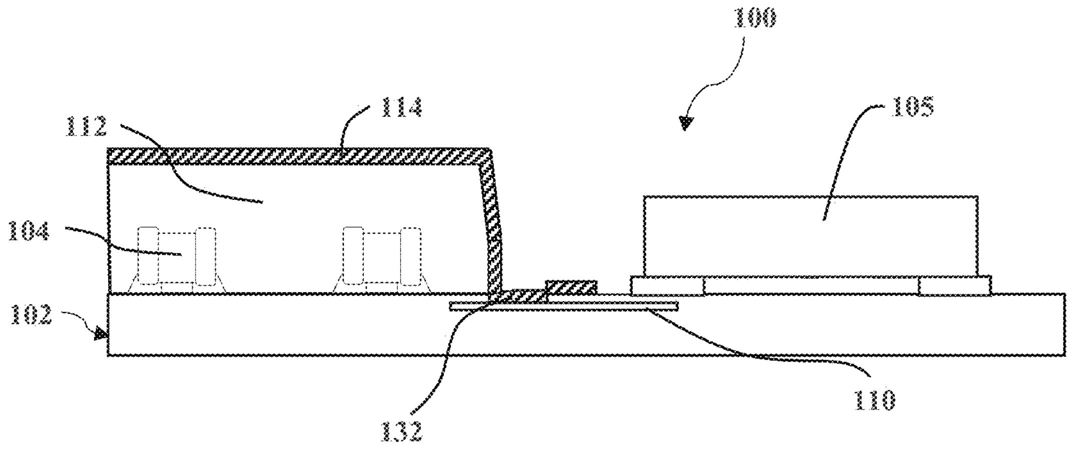
FIG. 3 illustrates a partial cross-sectional view of a SiP module integrated with a semiconductor device according to an embodiment of the present application.

In addition to electronic components 104 covered by the shielding layer 114, the semiconductor device may include one or more unshielded electronic component 105 that may have a different requirement on EMI shielding, due to their respective functions in the semiconductor device 100, as illustrated in FIG. 3. In some embodiments, the unshielded electronic component 105 may include board-to-board connectors, antennas or other components that do not require EMI shielding. The shielded electronic components 104 and the unshielded electronic component 105 are preferably situated on opposite sides of the opening 132. Accordingly, the shielding layer 114 formed on the substrate 102 may be a partial shielding layer that does not extend over an entirety of the substrate 102. For example, a deposition mask (not shown) can be used to cover the electronic components 105 but expose the other components on the substrate 102. As such, the shielding layer 114 may be selectively formed to not cover the electronic components 105.

It can be seen that since the opening 132 over the conductive bar 110 is formed adjacent to the encapsulant layer 112 instead of at distance away from the encapsulant layer 112, the distance between the shielded electronic components 104 and the unshielded electronic component 105 can be reduced. In this way, package form factor is improved, for example in an area on a side of the unshielded electronic component 105 opposite to the shielded electronic components 104. The semiconductor device 100 may be in the form of a system-in-package (SiP) module as shown in FIG. 3, i.e., various components of a system can be integrated within the semiconductor device 100.

Figure 4A:
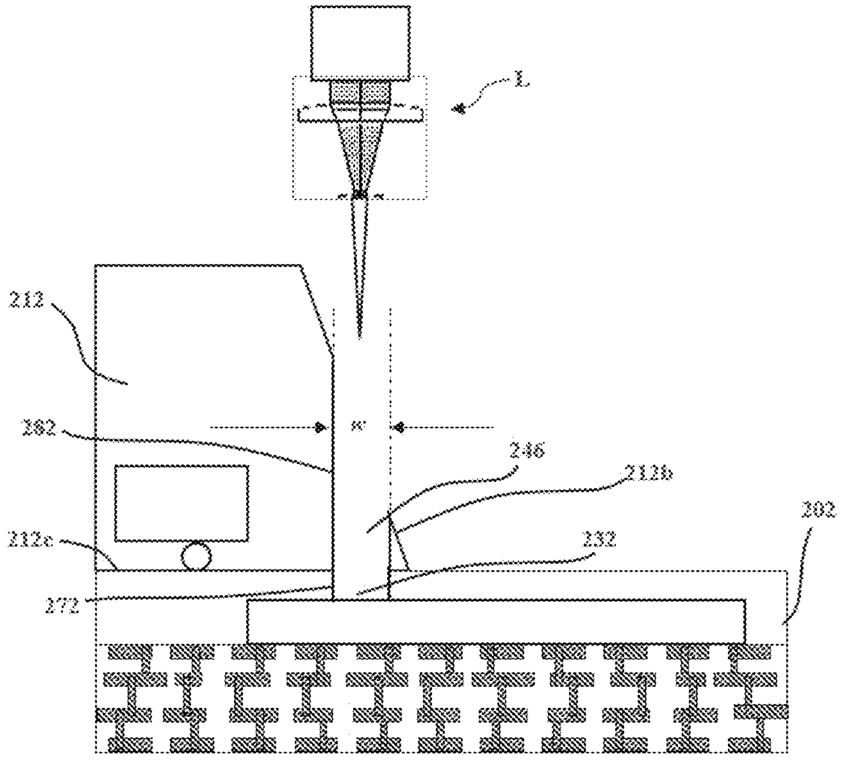
FIGS. 4A and 4B illustrate partial cross-sectional views of steps of a process for making a semiconductor device according to another embodiment of the present application.
Figure 4B:
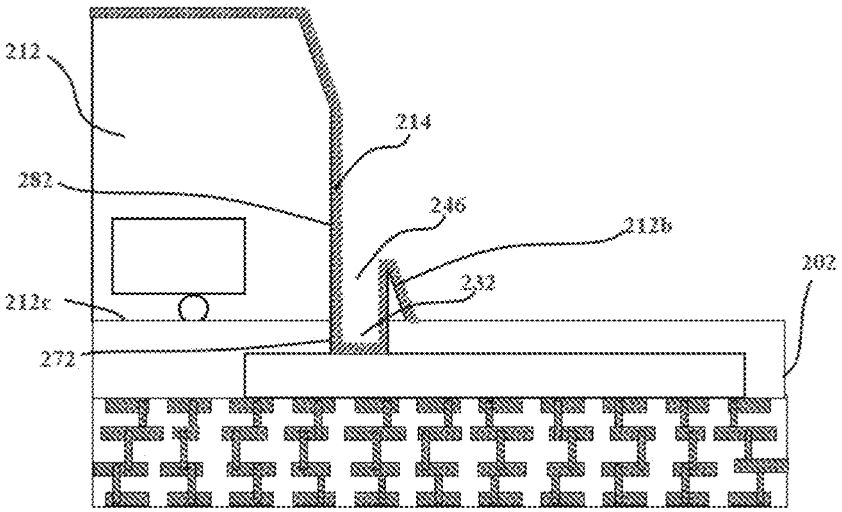

FIGS. 4A and 4B illustrate cross-sectional views of steps of a process for making a semiconductor device according to another embodiment of the present application.

As shown in FIGS. 4A and 4B, the width w of the opening 232 and the position of the laser cutting may be chosen such that an aperture 246 is formed in the encapsulant layer 212 after the laser cutting. The aperture 246 extends between the side surface 212*b* and the bottom surface 212*c* of the encapsulant layer 212. In other words, the opening 232 within the substrate 202 can be extended by the aperture 246 within the encapsulant layer 212 upward, and accordingly, an internal surface 272 of the opening 232 is extended by an internal surface of 282 the aperture 246. This embodiment is particularly advantageous when the encapsulant layer 212 flows during the injection molding process over a relatively large surface on the substrate and it is not required to remove all the encapsulant material escaped out the mold cover. In the illustrated embodiment, the aperture 246 and the opening 232 extend in a direction perpendicular to the bottom surface 212*c* of the encapsulant layer 212.

A shielding layer 214 is further deposited on the substrate 202 to cover entirely the encapsulant layer 212 (except the bottom surface 212*c* thereof) and extends continuously between the encapsulant layer 212 and the opening 232. The shielding layer 214 preferably covers entirely the internal surface 282 of the aperture 246 and the internal surface 272 of the opening 232.

By providing the portion of the conductive bar exposed from the encapsulant layer and the substrate and shielded for grounding adjacent to the encapsulant layer or under an aperture in the encapsulant layer, the distance between shielded electrically components and eventually other unshielded components, for example a board-to-board (B2B) connector in a B2B area, may be reduced. In this way, the number of components in the area is increased or the component size benefits are obtained, which allows to improve the form factor of the semiconductor device. The invention thus makes it possible to apply small form factor during package design or to mount more components or consider larger-sized components.

Figure 5A:
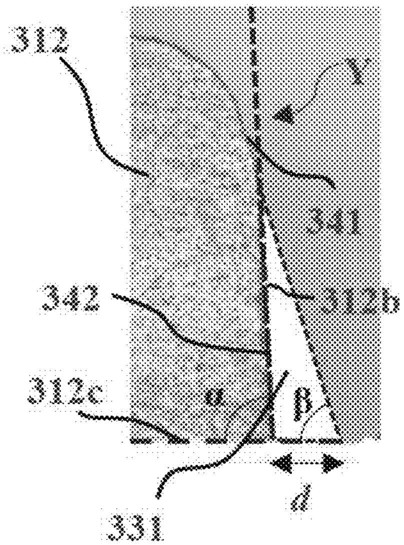
FIGS. 5A and 5B illustrate microscopic images of two exemplary encapsulant layers before and after laser cutting according to embodiments of the present application.
Figure 5B:
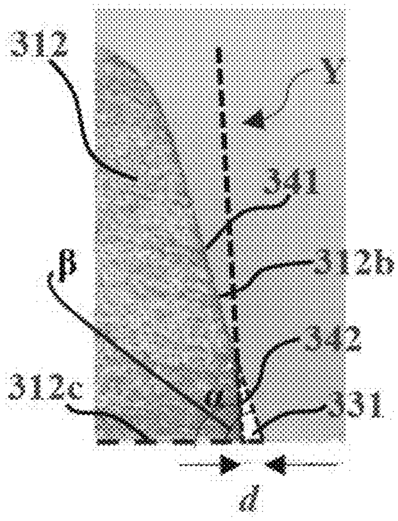

FIGS. 5A and 5B illustrate microscopic images of two exemplary encapsulant layers before and after laser cutting according to embodiments of the present application.

As shown in FIGS. 5A and 5B, the encapsulant layer 312 is cut in a way similar to the embodiment illustrated in FIGS. 2A and 2B, wherein the side surface 312*b* becomes angled with the upper side surface 341 forming a slope angle β with the bottom surface 312*c* of the encapsulant layer 312 and the lower side surface 342 forming a slope angle α with the bottom surface 312*c* of the encapsulant layer 312. β is smaller than a and both angles α and β are acute angle in the illustrated embodiments of FIGS. 5A and 5B. The slope angle α corresponds to an angle of laser cutting and a width of laser cutting corresponds to the width d of a lower surface of the removed portion 331 of the encapsulant layer 312 in the illustrated embodiments. The angle and width of laser cutting can be varied without going beyond the scope of the present invention. The angle of laser cutting a is preferably between 80° and 90°. Such angle range limits the extension of the opening and of the aperture where appropriate, in a direction parallel to the substrate and therefore, makes it easier to position the exposed portion along the conductive bar. Such angle range also makes it easier to perform the laser cutting since the distance travelled by the laser beam to reach the conductive bar is relatively shorter. Further, such angle range also makes it easier to have a homogenous deposition of the shielding layer in the opening after laser cutting since the sloping angle of the internal surface of the opening is relatively small and thus more accessible.

Figure 6A:
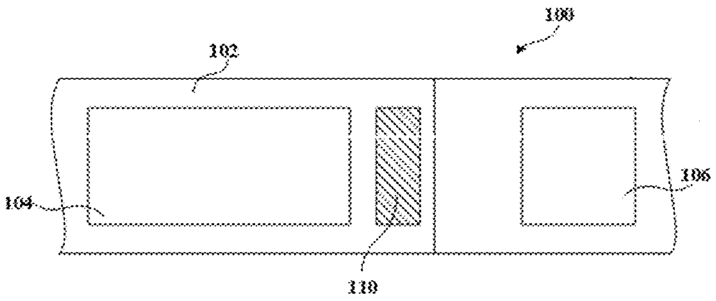
FIGS. 6A to 6C illustrate some exemplary semiconductor devices according to embodiments of the present application.
Figure 6B:
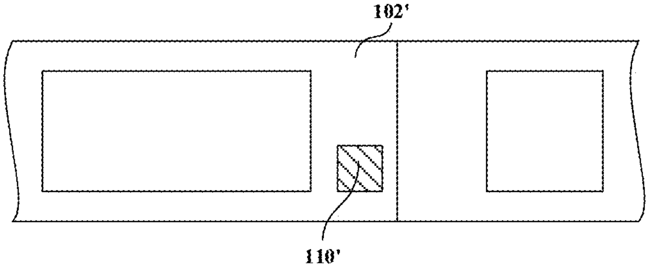
Figure 6C:
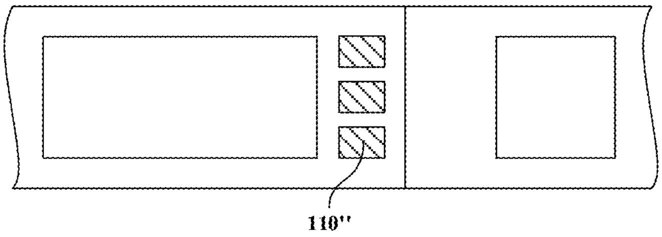

In some embodiments, the conductive bar embedded within the substrate of the semiconductor device may be a single conductive bar with a width substantially equal to that of the semiconductor component, as illustrated in FIG. 6A. In some other embodiments, the conductive bar may have alternative forms or patterns. FIGS. 6B and 6C illustrate two other semiconductor devices according to embodiments of the present application. As shown in FIG. 6B, a conductive bar may have a smaller width than the conductive bar shown in FIG. 6A, and thus it may occupy a smaller footprint on the substrate. In FIG. 6C, the semiconductor device may comprise multiple separated conductive bars, all of which can be covered by and connected with a shielding layer (not shown). The number and arrangement of the exposed portion or portions of the conductive bar or conductive bars can also be varied.

The discussion herein included numerous illustrative figures that showed various portions of a semiconductor device and a method for making such semiconductor device. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making a semiconductor device, the method comprising:

providing a substrate comprising an interconnection structure and a conductive bar connected to the interconnection structure;

forming at least one electronic component on the substrate;

forming an encapsulant layer covering the at least one electronic component;

removing a portion of the encapsulant layer and a portion of the substrate which is at least partially under the portion of the encapsulant layer to expose at least a portion of the conductive bar;

depositing a conductive material on the substrate to form a shielding layer on the substrate, wherein the shielding layer extends at least partially over the portion of the conductive bar exposed from the encapsulant layer and the substrate to electrically connect with the conductive bar; and providing on the substrate, on a side of the portion of the conductive bar exposed from the encapsulant layer and the substrate opposite to the encapsulant layer, a board-to-board connector.

2. The method of claim 1, wherein the encapsulant layer is formed to overlap at least partially with the conductive bar.

3. The method of claim 1, wherein the encapsulant layer is deposited on the substrate using compressive molding, transfer molding or liquid encapsulant molding.

4. The method of claim 1, further comprising removing the portion of the encapsulant layer and the portion of the substrate by laser cutting.

5. The method of claim 1, wherein the substrate comprises a base layer and a top layer over the base layer, and wherein the method comprises forming the interconnection structure in the base layer and disposing the conductive bar on the interconnection structure, before forming the top layer over the base layer to cover the conductive bar and a conductive pattern.

6. The method of claim 1, wherein after removing a portion of the encapsulant layer, the encapsulant layer has an angled sidewall.

7. The method of claim 6, wherein after removing a portion of the encapsulant layer, a side surface of the encapsulant layer comprises an upper side surface and a lower side surface, and the lower side surface has a slope angle larger than a slope angle of the upper side surface.

8. The method of claim 6, wherein after removing a portion of the encapsulant layer, a side surface of the encapsulant layer comprises an upper side surface and a lower side surface, and the lower side surface is perpendicular with regard to a bottom surface of the encapsulant layer.

9. The method of claim 1, wherein the shielding layer covers entirely the encapsulant layer, except a bottom surface thereof, and the shielding layer extends continuously between the encapsulant layer and an opening over at least a portion of the conductive bar.

* * * * *